United States Patent
Zinn (10) Patent No.: US 9,184,278 B2
(45) Date of Patent: Nov. 10, 2015

(54) PLANAR VERTICAL DMOS TRANSISTOR WITH A CONDUCTIVE SPACER STRUCTURE AS GATE

(71) Applicant: Micrel, Inc., San Jose, CA (US)

(72) Inventor: David Raymond Zinn, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 14/101,244

(22) Filed: Dec. 9, 2013

(65) Prior Publication Data

US 2015/0162430 A1    Jun. 11, 2015

(51) Int. Cl.
*H01L 29/78* (2006.01)
*H01L 29/66* (2006.01)
*H01L 29/10* (2006.01)

(52) U.S. Cl.
CPC .......... *H01L 29/7802* (2013.01); *H01L 29/105* (2013.01); *H01L 29/66712* (2013.01)

(58) Field of Classification Search
CPC .................. H01L 29/42376; H01L 29/42368; H01L 21/28114; H01L 21/28132; H01L 29/7802; H01L 29/66712; H01L 29/105
USPC ......... 257/286, 290, 289, 335, 341, 343, 346, 257/369, 409
See application file for complete search history.

(56) References Cited

U.S. PATENT DOCUMENTS

| | | | |
|---|---|---|---|
| 6,200,865 B1 * | 3/2001 | Gardner et al. ............... | 438/291 |
| 6,630,720 B1 * | 10/2003 | Maszara et al. ............... | 257/407 |
| 6,946,335 B1 * | 9/2005 | Ip et al. ......................... | 438/197 |
| 8,525,257 B2 | 9/2013 | Alter et al. | |
| 2002/0005550 A1 | 1/2002 | Takahashi et al. | |
| 2006/0138537 A1 * | 6/2006 | Arena et al. .................. | 257/341 |
| 2006/0240625 A1 | 10/2006 | Loechelt et al. | |
| 2007/0215914 A1 * | 9/2007 | Loechelt ....................... | 257/288 |
| 2010/0289085 A1 | 11/2010 | Yuan et al. | |
| 2015/0162430 A1 | 6/2015 | Zinn | |

OTHER PUBLICATIONS

Process Specialties, "Thermal oxidation;" Dec. 1985.*

* cited by examiner

*Primary Examiner* — Mamadou Diallo
*Assistant Examiner* — Christina Sylvia
(74) *Attorney, Agent, or Firm* — Van Pelt, Yi & James LLP (57) ABSTRACT

A planar vertical DMOS transistor uses a conductive spacer structure formed on the sides of a dielectric structure as the gate of the transistor. The planar vertical DMOS transistor with a conductive spacer gate structure reduces the parasitic gate-to-bulk or gate-to-drain overlap capacitance by eliminating the conductive gate material that is formed above the bulk of the semiconductor layer. Meanwhile, the desired distance between the body regions formed on opposing sides of the conductive spacer gate structure is maintained.

19 Claims, 9 Drawing Sheets

PLANAR VERTICAL DMOS TRANSISTOR WITH A CONDUCTIVE SPACER STRUCTURE AS GATE

BACKGROUND OF THE INVENTION

A metal-oxide-semiconductor (MOS) transistor is a semiconductor device that has heavily-doped source and drain regions which are separated by a lightly-doped channel region of the opposite conductive type. A conductive gate is formed above the channel region and insulated from the channel region by a gate oxide layer. The conductive gate of a MOS transistor is typically formed with doped polysilicon.

In some high voltage applications, such as DC-DC converters or switching regulators, high voltage integrated circuit devices or power transistors are used. A double-diffused MOS (DMOS) transistor is a power transistor commonly used in high-voltage applications (20 to 500 volts) because of their high breakdown voltage characteristics and compatibility with CMOS fabrication technology. A DMOS transistor has a lightly-doped drain region, also referred to as a drift region, that lies between the channel region and the heavily-doped drain region. The lightly-doped drift region carries the current flow between the source and drain and can sustain a voltage drop greater than that of traditional CMOS transistors.

DMOS transistors can be formed as vertical devices or lateral devices. A vertical DMOS transistor has source and drain regions that are vertically spaced apart and at least a portion of the current path between the source and drain is vertical or perpendicular to the planar surface of the semiconductor layer. The vertical DMOS transistor is typically formed using a heavily doped semiconductor substrate as the drain region. A lateral DMOS (or LDMOS transistor) has source and drain regions that are horizontally spaced apart and a current path between the source and drain is horizontal only or parallel to the planar surface of the semiconductor layer.

A vertical DMOS transistor can be formed using a planar gate or a trench gate. In a trench DMOS transistor, the gate electrode is formed in a trench and the channel is formed in a vertical region along the sidewall of the trench. The trench DMOS transistor has a vertical current path with the source region on the top side and the drain terminal on the back side of the transistor device. Trench DMOS transistors are typically more expensive to manufacture and have higher gate capacitance as the entire gate is formed in a trench and surrounded by the semiconductor substrate.

Figure 1:
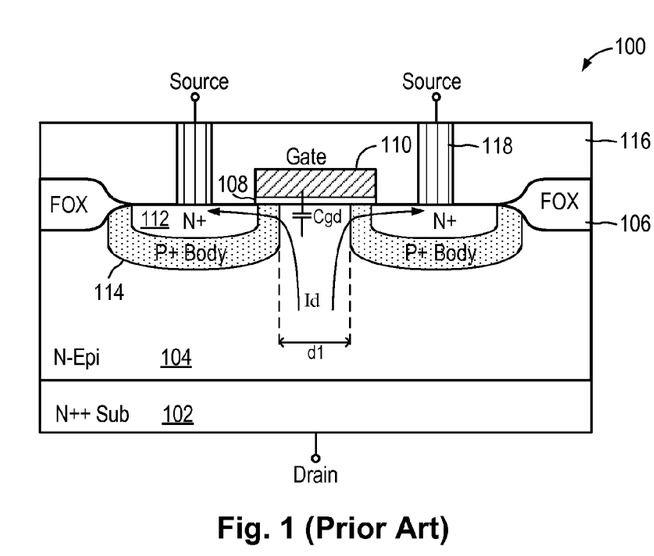
FIG. 1 is a cross-sectional view of a conventional planar vertical DMOS transistor.

FIG. 1 is a cross-sectional view of a conventional planar vertical DMOS transistor. In the present example, an N-type planar vertical DMOS transistor is shown. Referring to FIG. 1, a planar vertical DMOS transistor 100 is formed on an N++ substrate 102 as the drain region and an N-type semiconductor layer 104 as the drain drift region. The N-type semiconductor layer 104 is typically an N-type epitaxial layer. A planar gate 110, typically a polysilicon gate, is formed on a top surface of the semiconductor layer 104 and is insulated from the semiconductor layer by a thin gate oxide layer 108. N+ source regions 112 are formed in the semiconductor layer 104 on either sides of the planar gate 110. The N+ source regions 112 are formed inside P+ body regions 114. The channel region of the planar vertical DMOS transistor 100 is formed in a lateral region where the body region 114 overlaps the planar gate 110. The current path between the drain region (N++ substrate 102) and the source region 112 includes a vertical current path in the drain drift region (N-type semiconductor layer 104) and a lateral current path through the channel region.

In the planar vertical DMOS transistor 100 of FIG. 1, the overlap of the planar gate to the N-type semiconductor layer 104 outside of the channel region results in a gate-to-bulk or gate-to-drain overlap capacitance Cgd. This parasitic capacitance Cgd is a primary contributor to efficiency loss in switching applications. The gate-to-drain overlap capacitance can be reduced by narrowing the width of the planar gate, i.e., shortening the distance separating the two source regions 112 on either side of the planar gate. However, narrowing the width of the planar gate also narrows the distance d1 between the two body regions 114 on either side of the planar gate. Narrowing the distance d1 can cause the body region boundaries to become too close, resulting in an increased drain resistance due to depletion region pinch-off. Thus, in most cases, a minimum poly gate width is required to avoid pinch-off in the drain drift region of the planar vertical DMOS transistor.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to one aspect of the present invention, a planar vertical DMOS transistor uses a conductive spacer structure formed on the sides of a dielectric placeholder structure as the gate of the transistor. The planar vertical DMOS transistor with a conductive spacer gate structure reduces the parasitic gate-to-bulk or gate-to-drain overlap capacitance by eliminating the conductive gate material that is formed above the bulk of the semiconductor layer. Meanwhile, the desired distance between the body regions formed on opposing sides of the conductive spacer gate structure is maintained to prevent undesirable pinch off in the drain drift region of the DMOS transistor.

According to another aspect of the present invention, a planar vertical DMOS transistor includes a dielectric separation structure formed under the conductive gate and over the bulk of the semiconductor layer outside of the channel region of the transistor. The planar vertical DMOS transistor with a conductive gate formed over the dielectric structure reduces the parasitic gate-to-bulk or gate-to-drain overlap capacitance by increasing the separation between the conductive gate and the bulk of the semiconductor layer. Meanwhile, the desired distance between the body regions formed on opposing sides of the conductive gate is maintained to prevent undesirable pinch off in the drain drift region of the DMOS transistor.

In the present description, a planar vertical DMOS transistor refers to a vertical DMOS transistor formed using a planar gate and source and drain regions that are vertically spaced apart. The planar vertical DMOS transistor has at least a portion of the current path between the source region and drain region that is vertical or perpendicular to the planar surface of the semiconductor body in which the transistor is formed. The semiconductor body is sometimes referred to as the bulk of the transistor. Typically, the planar vertical DMOS transistor has a lateral channel region and a vertical drain drift region formed in the bulk of the transistor. A planar vertical DMOS transistor is different from a lateral DMOS or LDMOS transistor in that the LDMOS transistor has a current path that is primarily horizontal and the source and drain regions are formed horizontally spaced apart on the same surface of the semiconductor body. A planar vertical DMOS transistor is different from a trench DMOS in that the trench DMOS uses a gate that is formed in a trench in the semiconductor body. The planar vertical DMOS transistor has a planar gate structure that is formed on and insulated from the top surface of the semiconductor layer but a drain drift region that is formed in the semiconductor body to connect to a drain region formed on the back-side of the semiconductor body.

Conductive Spacer Gate Structure

Figure 2:
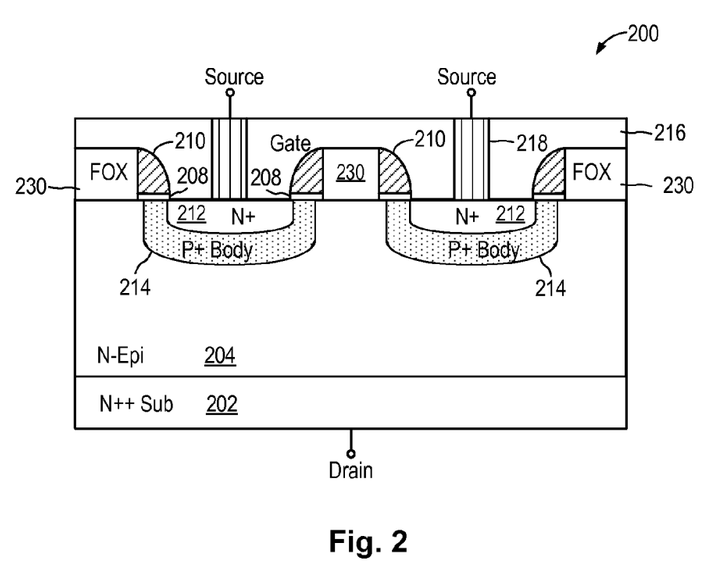
FIG. 2 is a cross-sectional view of a planar vertical DMOS transistor incorporating a conductive spacer gate structure in embodiments of the present invention.

FIG. 2 is a cross-sectional view of a planar vertical DMOS transistor incorporating a conductive spacer gate structure in embodiments of the present invention. In the present example, the planar vertical DMOS transistor is implemented as an N-type transistor. The use of an N-type DMOS transistor is illustrative only and not intended to be limiting. In other embodiments, the planar vertical DMOS transistor of the present invention can be implemented as a P-type transistor by using doping regions of the opposite conductivity types, as is well known in the art.

Referring to FIG. 2, an N-type planar vertical DMOS transistor 200 is formed in a semiconductor body including a heavily doped N++ substrate 202 and a lightly doped N-type semiconductor layer 204. The N-type semiconductor layer 204 is typically an N-type epitaxial layer (N-Epi). The N++ substrate 202 serves as the heavily doped drain region and the N-type semiconductor layer 204 serves as the drain drift region of the DMOS transistor 200.

In DMOS transistor 200, a planar gate 210 is formed on a top side of the semiconductor body (or the top surface of the N-Epi layer 204) and is insulated from the semiconductor layer by a thin gate oxide layer 208. In the present embodiment, the planar gate 210 is formed as pairs of conductive spacer structures formed on the opposite sides of a dielectric placeholder structure 230. The gate 210 is formed as stripes that extend in the z-direction (perpendicular to the cross-section surface) and the stripes are electrically connected together at pre-defined locations on the semiconductor body, such as through the use of conductive lines. In some embodiments, the gate 210 is a polysilicon gate. In some embodiments, the resistance of the polysilicon gate can be reduced by using a salicide process, that is, by forming a salicide layer on top of the polysilicon layer.

The dielectric placeholder structure 230 provides the support for forming the spacer structures and also serves to block subsequent self-aligned implant into the area under the structure 230 so that the drain drift region formed in the semiconductor layer 204 is retained. Furthermore, the use of the dielectric placeholder structure 230 allows the conductive spacer gate structures to be formed at a given fixed pitch so that the body regions of the DMOS transistor maintains a desired separation to avoid pinch-off in the drain drift region, as will be described in more detail below. In some embodiments, the conductive spacer gate structure 210 is formed by depositing a conformal polysilicon layer on the top surface of the semiconductor body, over the dielectric placeholder structure 230, and then anisotropically etching the polysilicon layer to form the spacer structures on the sides of the dielectric placeholder structure 230.

The DMOS transistor 200 further includes P-type body regions 214 formed between the conductive spacer gate structure 210. The P-type body regions 214 extends under the conductive spacer gate structures 210 and the overlapped portions of the P-type body regions 214 under the gate 210 form the channel region of the DMOS transistor. The DMOS transistor 200 includes heavily doped N-type source regions 212 formed in the body regions 214 and aligned to the outer edges of the conductive spacer gate structure 210. As thus constructed, the DMOS transistor 200 includes channel regions formed on both ends of the P-type body regions 214. To complete the DMOS transistor, an interlayer dielectric layer 216 may be formed over the semiconductor layer 204 and contact openings may be formed in the dielectric layer 216 to provide access to the source regions 212. Metallization may be used to fill the contact openings to form source contacts 218. The backside of the substrate 202 may also be provided with a metallization layer to form the drain electrode.

In one embodiment, the P-type body region 214 is formed using a self-aligned implant relative to the conductive spacer gate structure 210 and the dielectric placeholder structure 230. Subsequent anneal and diffusion of the P-type dopants form the overlap area of the body region under the gate structure 210. The dielectric placeholder structure 230 has a thickness sufficient to block the self-align implant so that no P-type dopant penetrates the placeholder structure 230. In some embodiments, the self-aligned body implant process is performed using two or more implantation steps. In other embodiments, the P-type body regions 214 can be formed using masking and implantation processes.

The DMOS transistor 200 thus formed includes a lateral channel region under the conductive spacer gate structure 210 and a vertical current path in the drain drift region (N-type semiconductor layer 204). The DMOS transistor 200 operates identically to the conventional DMOS transistor and retains all of the output characteristics of a conventional DMOS transistor. However, the DMOS transistor 200 thus formed realized many advantages over the conventional DMOS transistor.

First, the DMOS transistor 200 of the present invention enables the use of higher energy implant to form the body region so that the body region can be formed with a deeper and graded junction. A deeper and graded body region junction improves the breakdown characteristics of the DMOS transistor. In the conventional DMOS transistor, the thickness of the polysilicon layer used as the planar gate determines the energy of the body implant that can be used when self-aligned body implant process is employed. The implant energy must be low enough so that the body implant will not penetrate the polysilicon gate layer. Because the polysilicon gate layer is not that thick, a low implant energy has to be used which results in a shallow body junction.

However, in the DMOS transistor 200 of the present invention, the polysilicon layer is formed as spacer structures 210 alongside the dielectric placeholder structure 230. The thickness of the polysilicon layer defines the width of the spacer and the height of the polysilicon spacer can be made taller by the use of the dielectric placeholder structure 230. Because the entire spacer-gate-dielectric-placeholder structure can have a thickness greater than the thickness of the polysilicon layer alone, a higher implant energy can be used in the self-aligned body implant process in order to obtain deeper and graded junction.

Figure 3:
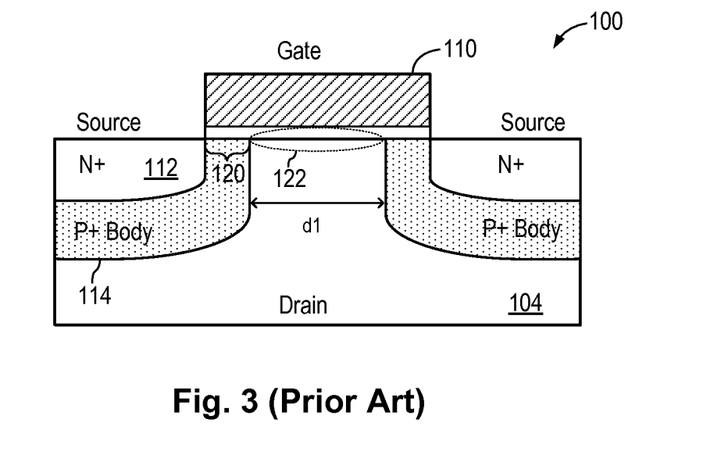
FIGS. 3 and 4 are exploded cross-sectional views of the conventional DMOS transistor of FIG. 1 and the DMOS transistor of FIG. 2 according to embodiments of the present invention.
Figure 4:
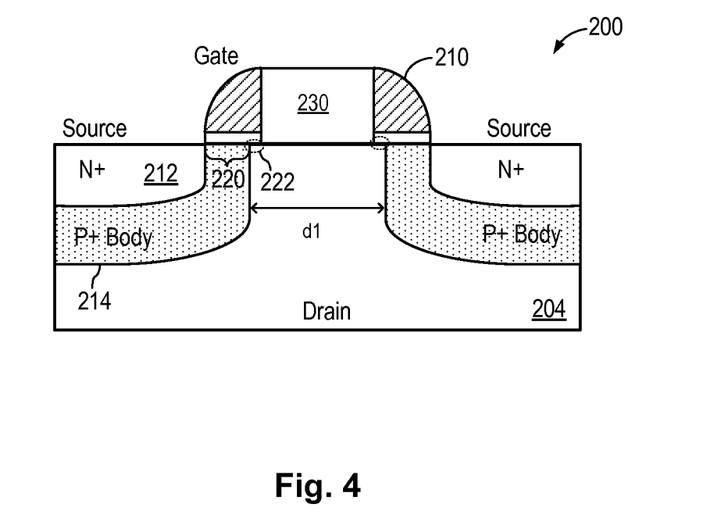

Second, the DMOS transistor 200 of the present invention achieves reduced gate charge than conventional planar vertical DMOS transistor by using spacer structures as the gate and eliminating most of the overlap portion of the gate over the bulk of the semiconductor body. FIGS. 3 and 4 are exploded cross-sectional views of the conventional DMOS transistor of FIG. 1 and the DMOS transistor of FIG. 2 according to embodiments of the present invention. Referring to FIG. 3, in the conventional DMOS transistor 100, the channel region is the lateral region 120. The gate-to-bulk overlap region 122 is the entire distance between the two body regions 114 because the planar gate 110 extends across the entire distance. On the other hand, in the DMOS transistor 200 of the present invention, the channel region remains the lateral region 220 under the conductive spacer gate structure 210. However, the gate-to-bulk overlap region 222 becomes very small by replacing the overlapping polysilicon layer with the dielectric placeholder structure 230. In particular, the resulting gate-to-bulk (drain) overlap can be tuned to be only as narrow as required to ensure connectivity of the channel to the drain. In one embodiment, the total gate charge of the DMOS transistor 200 is 30% of that of the conventional planar vertical DMOS transistor.

Third, by using a spacer structure as the gate, the gate can be formed with a critical dimension that is smaller than what the lithography process is capable. The width of the spacer gate structure is not limited by the capabilities of the fabrication process.

Finally, a salient feature of the DMOS transistor of the present invention is that the gate charge is reduced while maintaining the body to body spacing so as to avoid undesired pinch-off. Referring to FIG. 3, in the conventional DMOS transistor 100, the body regions 114 are separated by a distance "d1." Referring to FIG. 4, the DMOS transistor 200 of the present invention, through the use of the dielectric placeholder structure 230, preserves the distance d1 between two adjacent body regions. The distance d1 is necessary to ensures that the depletion regions formed in the drain drift region do not pinch off.

Figure 5A:
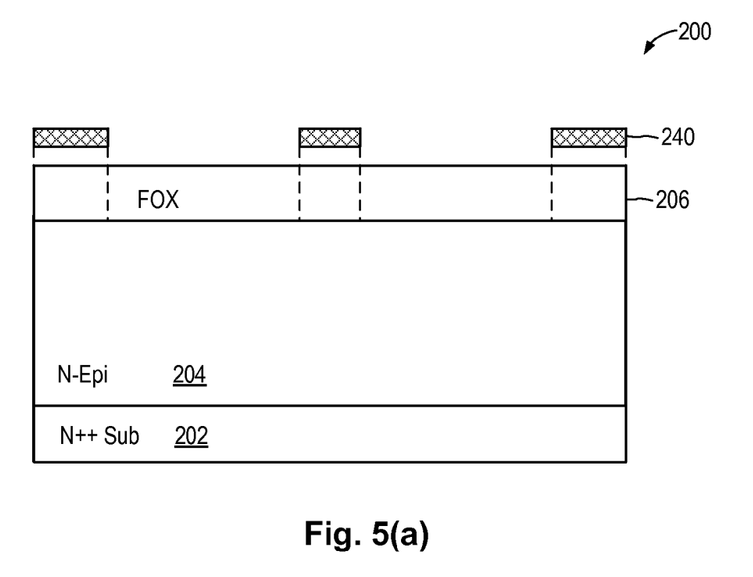
FIGS. 5(a) to 5(d) are cross-sectional view of fabrication process steps to form the planar vertical DMOS transistor incorporating a conductive spacer gate structure in embodiments of the present invention.
Figure 5B:
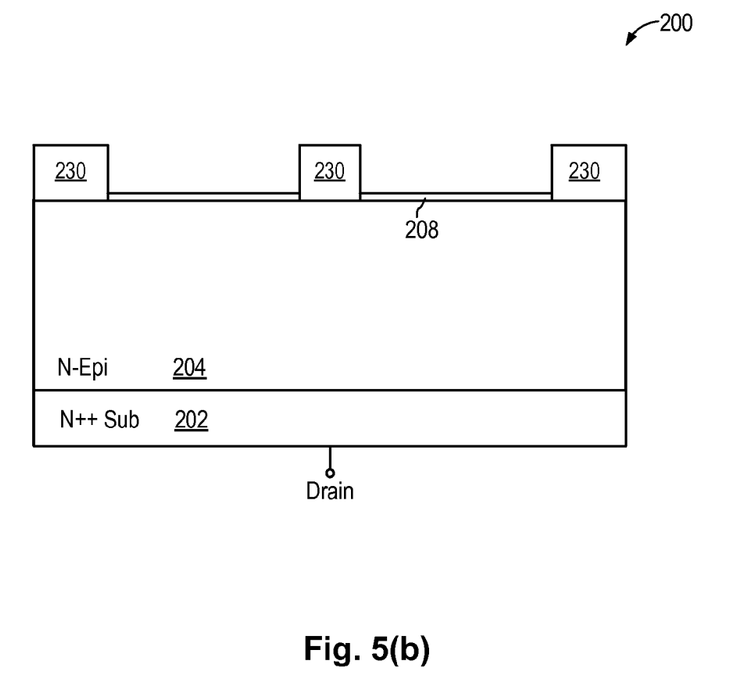
Figure 5C:
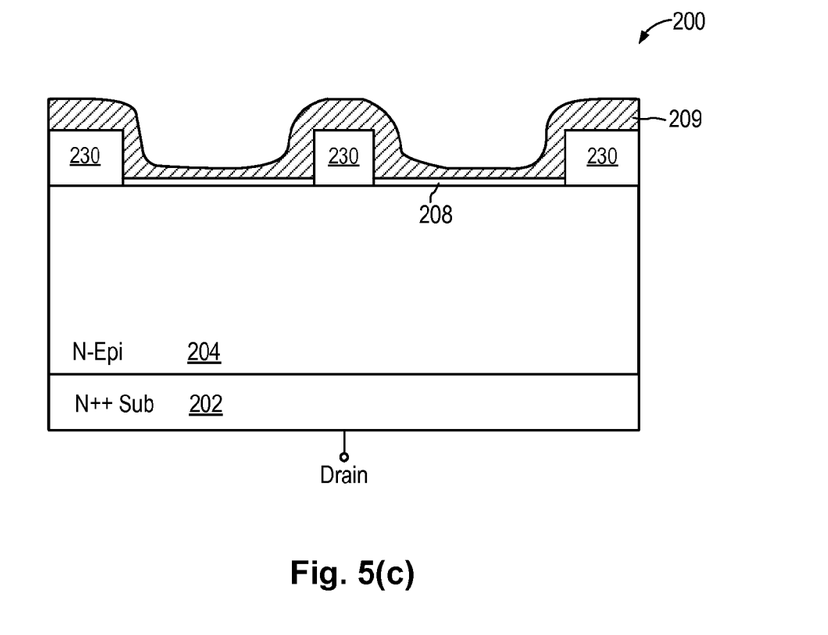
Figure 5D:
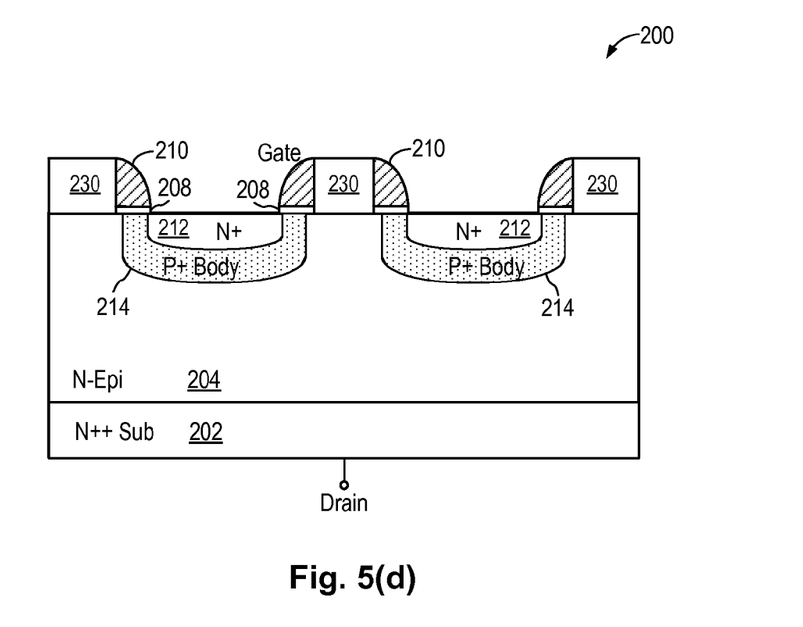
Figure 6:
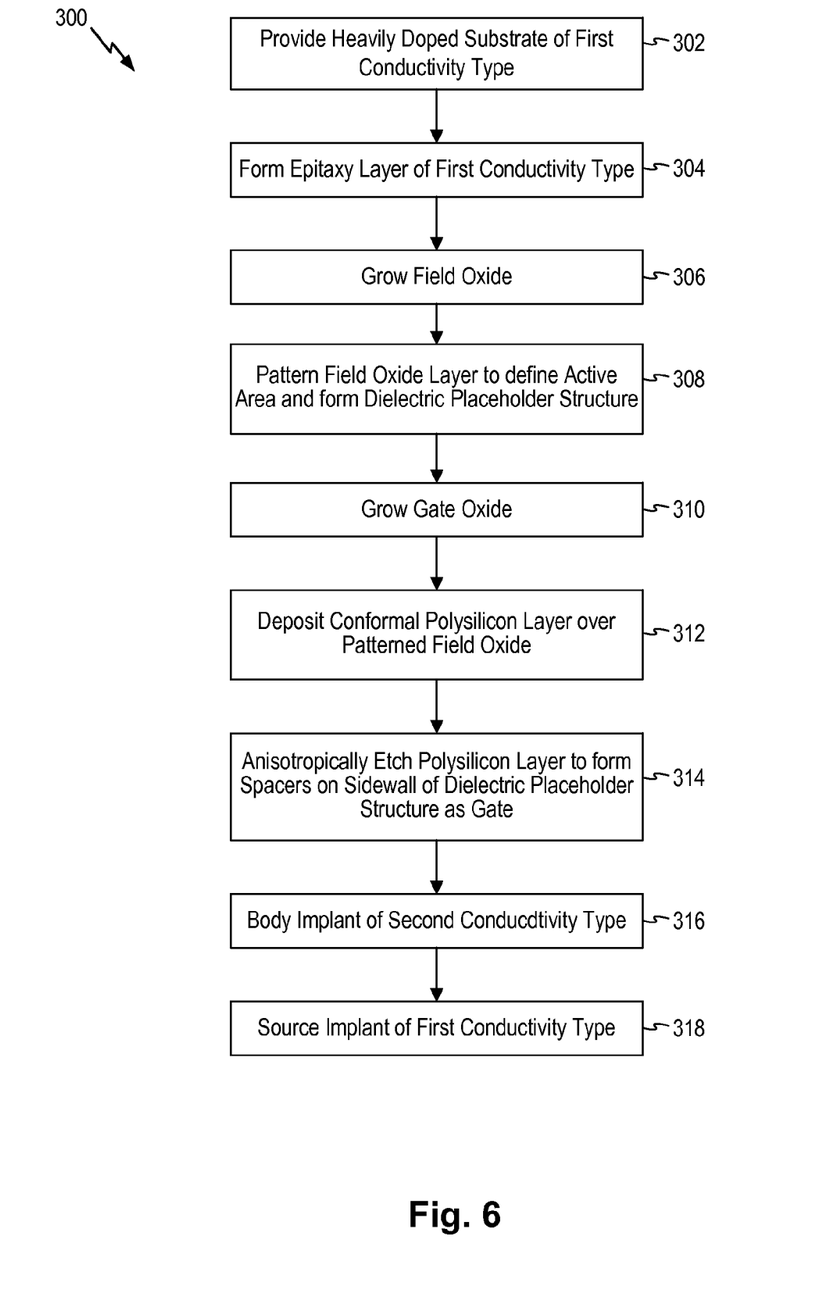
FIG. 6 is a flow chart illustrating the fabrication process steps to form the DMOS transistor in FIGS. 5(a)-(d).

FIGS. 5(a) to 5(d) are cross-sectional view of fabrication process steps to form the planar vertical DMOS transistor incorporating a conductive spacer gate structure in embodiments of the present invention. FIG. 6 is a flow chart illustrating the fabrication process steps used in forming the DMOS transistor in FIGS. 5(a)-(d). In the example shown in FIGS. 5(a)-(d) and 6, the dielectric placeholder structure 230 is formed using a field oxide layer. Forming the dielectric placeholder structure 230 using a field oxide layer is illustrative only and is not intended to be limiting. In other embodiments, the dielectric placeholder structure 230 can be formed using other dielectric material. Furthermore, in the example shown in FIGS. 5(a)-(d), the DMOS transistor thus formed is an N-type transistor. The use of an N-type DMOS transistor is illustrative only and not intended to be limiting. In other embodiments, the DMOS transistor can be formed as a P-type DMOS transistor.

Referring to FIGS. 5(a)-(d) and 6, a method 300 starts with a heavily doped substrate of the first conductivity type (302). The heavily doped substrate 202 forms the drain region of the DMOS transistor to be formed. In the present example, the substrate is an N++ substrate 202. At 304, method 300 forms an epitaxial layer of the first conductivity type. The epitaxial layer 204 forms the drain drift region of the DMOS transistor to be formed. In the present example, the epitaxial layer is an N-type epitaxial layer 204. When P-type DMOS transistor is to be formed, the substrate can be a P++ substrate and the epitaxial layer can be a P-type epitaxial layer. The substrate 202 and the epitaxial layer 204 form the semiconductor body or the bulk of the DMOS transistor.

At 306, a thermal oxidation process is performed to form a field oxide layer 206 on the semiconductor body. For example, the oxidation process can be a wet oxidation process. In the conventional fabrication process, the active area of the semiconductor body is masked before the thermal oxidation process to form the field oxide layer. The active area is the area where active devices, such as transistors, are to be formed. In the conventional fabrication process, the field oxide layer encircles or surrounds the active area. However, in the fabrication process of the present invention, the field oxide is formed in the active area of the semiconductor body. In the present example, the thermal oxidation process is applied to the entire surface of the semiconductor body without masking of the active area. Accordingly, a field oxide layer 206 is formed on the top surface of the semiconductor body.

At 308, the field oxide layer 206 is patterned to define the active area and also the dielectric placeholder structure. In the present example, a mask 240 is formed on the field oxide layer 206 and patterned to cover the area where the field oxide should remain. The field oxide layer 206 is then etched using the mask 240. After the oxide etching process, field oxide structures are formed which are used as the dielectric placeholder structure 230, as shown in FIG. 5(b).

At 310, a thermal oxidation process is performed to form a gate oxide layer 208 on the exposed surface of the semiconductor body. At 312, a conformal polysilicon layer 209 is formed on the semiconductor body, as shown in FIG. 5(c). The conformal polysilicon layer 209 is deposited on top of the dielectric placeholder structure 230. The polysilicon layer may be doped by ion implantation to the desired conductivity type and desired resistance. At 314, the conformal polysilicon layer is etched anisotropically to form conductive spacer gate structures 210 on the sidewall of the dielectric placeholder structure 230, as shown in FIG. 5(d). The polysilicon spacer structure 210 forms the gate of the DMOS transistor.

At 316, a body implant process using dopants of the second conductivity type is performed to form body regions on between the spacer gate structure 210. In the present example, P-type dopants are used in the body implant process. Furthermore, in one embodiment, the body implant is self-aligned to the spacer gate structure 210. At 318, a source implant process using dopants of the first conductivity type is performed to form source regions in the body regions. In the present example, N-type dopants are used in the source implant process. Furthermore, in one embodiment, the source implant is self-aligned to the spacer gate structure 210. After annealing, source regions 212 and body regions 214 are formed, as shown in FIG. 5(d). The planar vertical DMOS transistor 280 is thus formed. The DMOS transistor 280 thus formed includes a lateral channel region under the conductive spacer gate structure 210 and a vertical current path in the drain drift region (N-type semiconductor layer 204).

In some embodiments, additional processing steps may be performed to complete the DMOS transistor device to obtain the DMOS transistor of FIG. 2. For example, an interlayer dielectric layer 216 may be formed over the semiconductor body. Contact openings may be formed in the dielectric layer 216 to provide access to the source regions 212. Metallization may be used to fill the contact openings to form source contacts 218. The backside of the substrate 202 may also be provided with a metallization layer to form the drain electrode.

Dielectric Gate Separation Structure

According to another aspect of the present invention, a planar vertical DMOS transistor uses a dielectric separation structure under the conductive gate to separate the gate from the semiconductor body, thereby reducing the gate-to-drain overlap and the parasitic gate charge.

Figure 7:
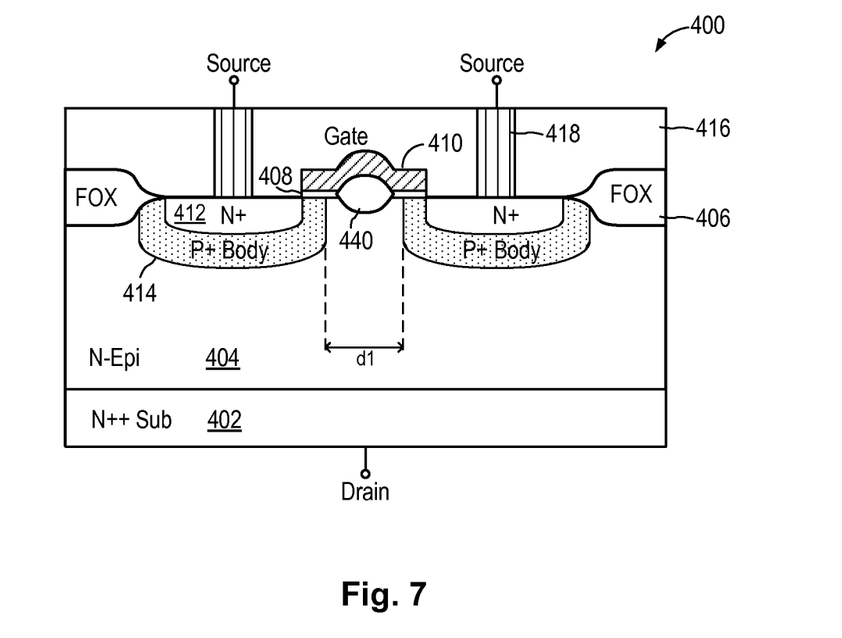
FIG. 7 is a cross-sectional view of a planar vertical DMOS transistor incorporating a dielectric separation structure in embodiments of the present invention.

FIG. 7 is a cross-sectional view of a planar vertical DMOS transistor incorporating a dielectric separation structure in embodiments of the present invention. In the present example, the planar vertical DMOS transistor is implemented as an N-type transistor. The use of an N-type DMOS transistor is illustrative only and not intended to be limiting. In other embodiments, the planar vertical DMOS transistor of the present invention can be implemented as a P-type transistor by using doping regions of the opposite conductivity types, as is well known in the art.

Referring to FIG. 7, an N-type planar vertical DMOS transistor 400 is formed in a semiconductor body including a heavily doped N++ substrate 402 and a lightly doped N-type semiconductor layer 404. The N-type semiconductor layer 404 is typically an N-type epitaxial layer (N-Epi). The N++ substrate 402 serves as the heavily doped drain region and the N-type semiconductor layer 404 serves as the drain drift region of the DMOS transistor 400.

In DMOS transistor 400, a planar gate 410 is formed on a top side of the semiconductor body (or the top surface of the N-Epi layer 404) and is insulated from the semiconductor layer by a thin gate oxide layer 408. In the present embodiment, the planar gate 410 is formed over a dielectric separation structure 440. The dielectric separation structure 440 is formed on the top surface of the semiconductor body and is positioned in the drain drift region of the DMOS transistor 400. Accordingly, the planar gate 410 is separated from the drain drift region of the semiconductor body by the dielectric separation structure 440. The gate 410 extends in the z-direction (perpendicular to the cross-section surface) and can be electrically connected to a gate voltage at a pre-defined location on the semiconductor body. In some embodiments, the gate 410 is a polysilicon gate. In some embodiments, the resistance of the polysilicon gate can be reduced by using a salicide process, that is, by forming a salicide layer on top of the polysilicon layer. In some embodiments, the width of the planar gate 410 is selected to give sufficient alignment tolerance to ensure a minimum gate extension on either side of the dielectric extension structure 440 over process variations.

In some embodiments, the dielectric separation structure 440 is a field oxide layer. Portions of the planar gate 410 are formed over the gate oxide layer to form the transistor gate. A portion of the planar gate 410 is formed over the field oxide layer which provides a larger separation between the planar gate and the semiconductor body. By increasing the dielectric separation between the gate and the semiconductor body, the dielectric separation structure 440 has the effect of reducing the parasitic gate-to-drain overlap capacitance in DMOS transistor 440. Meanwhile, the use of the dielectric separation structure 440 allows the body regions of the DMOS transistor to maintain a desired separation to avoid pinch-off in the drain drift region, as will be described in more detail below.

The DMOS transistor 400 further includes P-type body regions 414 formed on the outer sides of the planar gate 410. The P-type body regions 414 extends under the planar gate 410 and the overlapped portions of the P-type body regions 414 under the gate 410 form the channel region of the DMOS transistor. The DMOS transistor 400 includes heavily doped N-type source regions 412 formed in the body regions 414 and aligned to the outer sides of the planar gate 410. To complete the DMOS transistor, an interlayer dielectric layer 416 may be formed over the semiconductor layer 404 and contact openings may be formed in the dielectric layer 416 to provide access to the source regions 412. Metallization may be used to fill the contact openings to form source contacts 418. The backside of the substrate 402 may also be provided with a metallization layer to form the drain electrode.

In one embodiment, the P-type body region 414 is formed using a self-aligned implant relative to the planar gate 410. Subsequent anneal and diffusion of the P-type dopants form the overlap area of the body region under the gate structure 410. In some embodiments, the self-aligned body implant process is performed using two or more implantation steps. In other embodiments, the P-type body regions 414 can be formed using masking and implantation processes.

The DMOS transistor 400 thus formed includes a lateral channel region under the gate oxide layer 408 and the planar gate 410 outside of the dielectric separation structure 440 and a vertical current path in the drain drift region (N-type semiconductor layer 404). The DMOS transistor 400 operates identically to the conventional DMOS transistor and retains all of the output characteristics of a conventional DMOS transistor. However, the DMOS transistor 400 thus formed realized many advantages over the conventional DMOS transistor.

Figure 8:
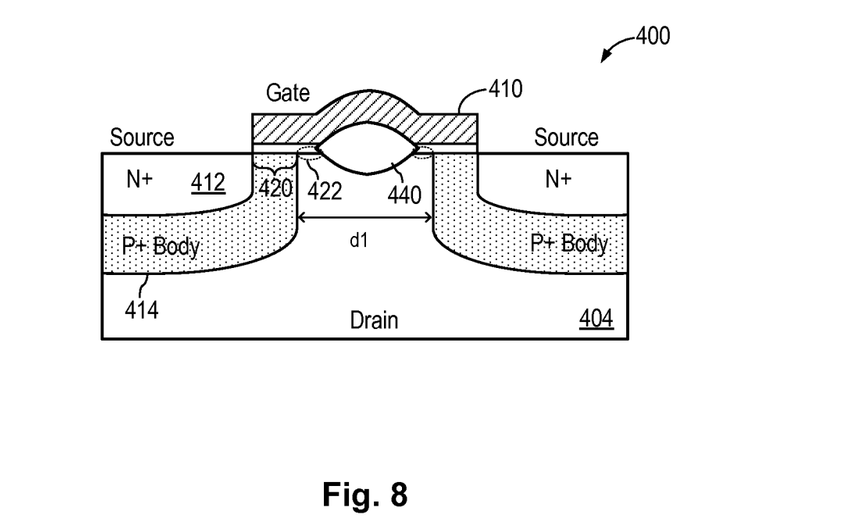
FIG. 8 is an exploded cross-sectional view of the DMOS transistor of FIG. 7 according to embodiments of the present invention.

First, the DMOS transistor 400 of the present invention achieves reduced gate charge than conventional planar vertical DMOS transistor while maintaining the same gate width. The use of the thick dielectric separation structure 440 under a portion of the planar gate 410 reduces the gate-to-drain overlap capacitance in the drain drift region, as compared to the conventional DMOS transistor in FIG. 3. As a result, the planar gate structure thus formed reduces the total gate charge by 50% as compared to the conventional planar DMOS transistor device. FIG. 8 is an exploded cross-sectional view of the DMOS transistor of FIG. 7 according to embodiments of the present invention. Referring to FIG. 8, in the DMOS transistor 400 of the present invention, the channel region is the lateral region 420 under the gate oxide layer 408 and the planar gate 410. However, the gate-to-bulk overlap region 422 becomes very small by using the dielectric separation structure 440 to separate the planar gate from the semiconductor body over the drain drift region.

Second, a salient feature of the DMOS transistor of the present invention is that the gate charge is reduced while maintaining the body to body spacing so as to avoid undesired pinch-off. Referring to FIG. 3, in the conventional DMOS transistor 100, the body regions 114 are separated by a distance "d1." Referring to FIG. 8, the DMOS transistor 200 of the present invention, through the use of the dielectric separation structure 440, preserves the distance d1 between two adjacent body regions. The distance d1 is necessary to ensures that the depletion regions formed in the drain drift region do not pinch off.

Figure 9A:
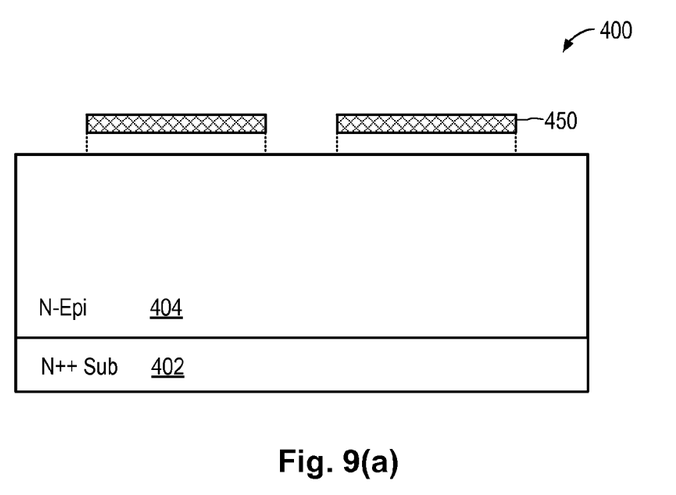
FIGS. 9(a) to 9(d) are cross-sectional view of fabrication process steps to form the planar vertical DMOS transistor incorporating a dielectric separation structure in embodiments of the present invention.
Figure 9B:
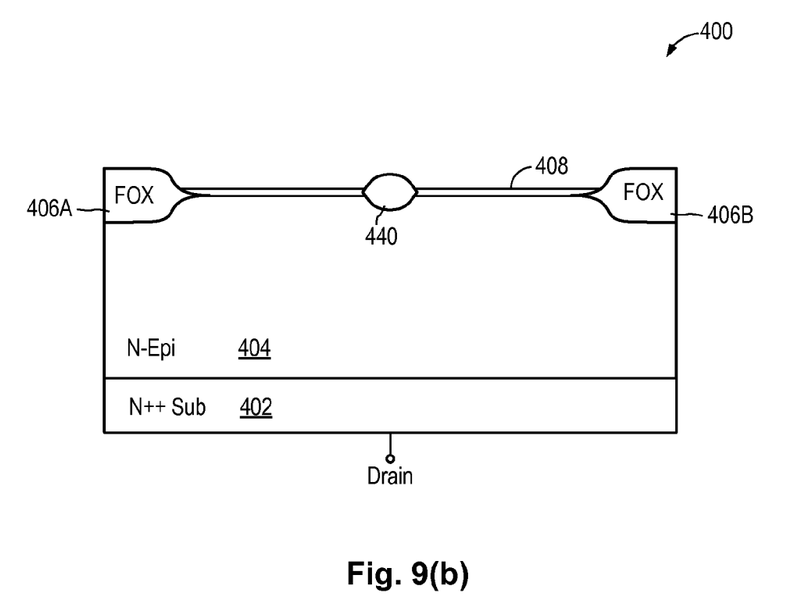
Figure 9C:
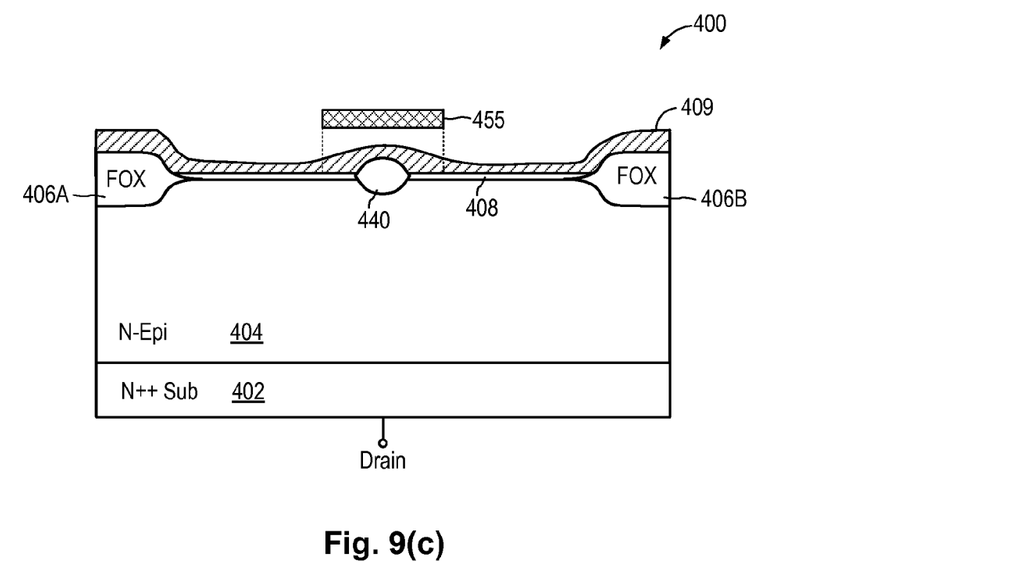
Figure 9D:
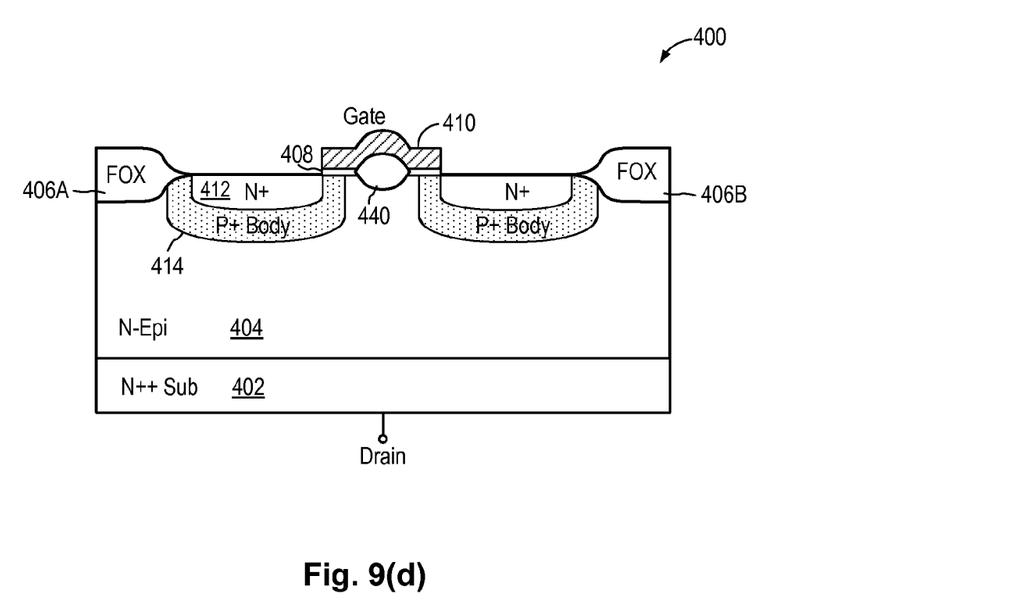
Figure 10:
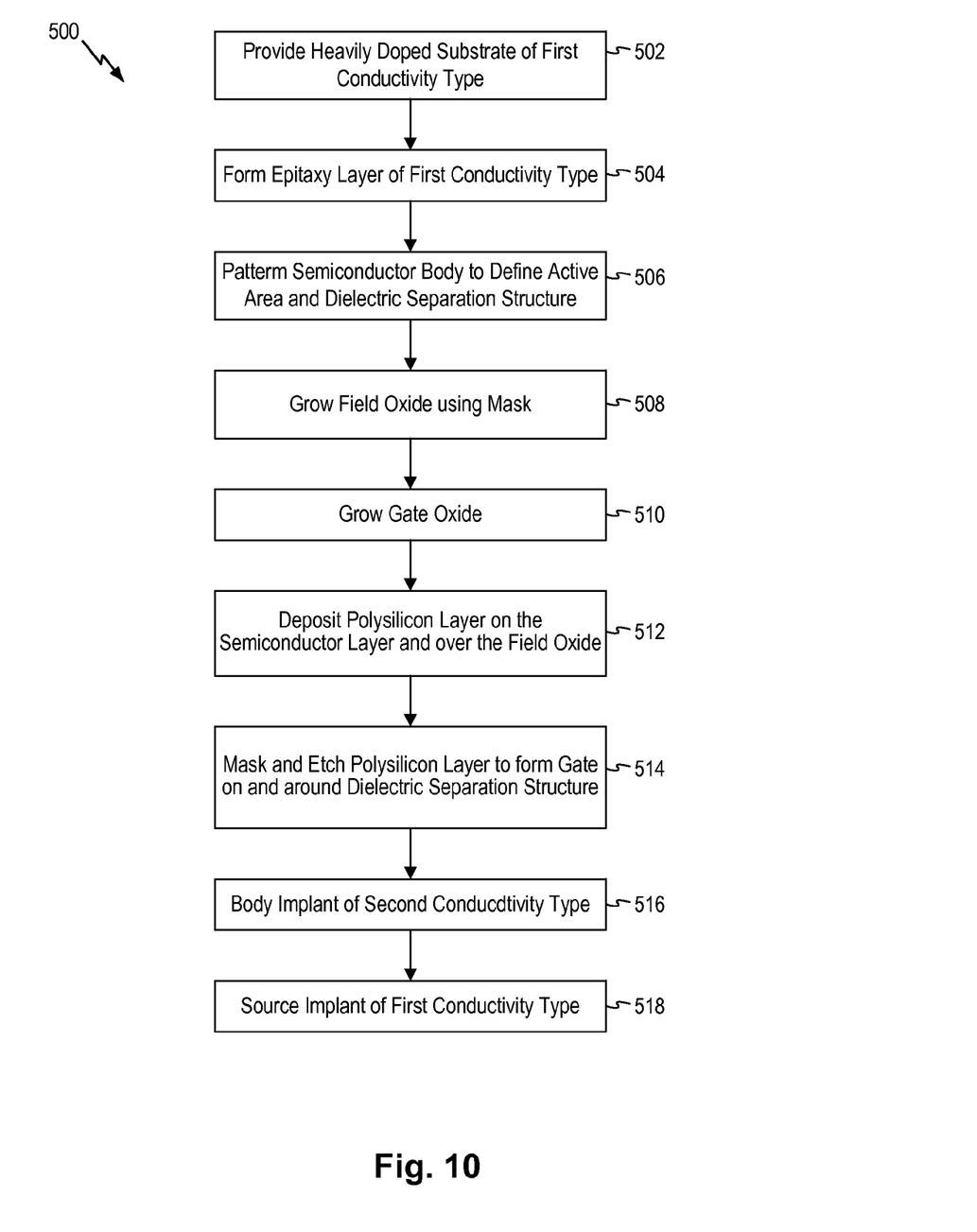
FIG. 10 is a flow chart illustrating the fabrication process steps used in forming the DMOS transistor in FIGS. 9(a)-(d).

FIGS. 9(*a*) to 9(*d*) are cross-sectional view of fabrication process steps to form the planar vertical DMOS transistor incorporating a dielectric separation structure in embodiments of the present invention. FIG. 10 is a flow chart illustrating the fabrication process steps used in forming the DMOS transistor in FIGS. 9(*a*)-(*d*). In the example shown in FIGS. 9(*a*)-(*d*) and 10, the dielectric separation structure 440 is formed using a field oxide layer. Forming the dielectric separation structure 440 using a field oxide layer is illustrative only and is not intended to be limiting. In other embodiments, the dielectric separation structure 440 can be formed using other dielectric material. Furthermore, in the example shown in FIGS. 9(*a*)-(*d*), the DMOS transistor thus formed is an N-type transistor. The use of an N-type DMOS transistor is illustrative only and not intended to be limiting. In other embodiments, the DMOS transistor can be formed as a P-type DMOS transistor.

Referring to FIGS. 9(*a*)-(*d*) and 10, a method 500 starts with a heavily doped substrate of the first conductivity type (502). The heavily doped substrate 402 forms the drain region of the DMOS transistor to be formed. In the present example, the substrate is an N++ substrate 402. At 504, method 500 forms an epitaxial layer of the first conductivity type. The epitaxial layer 404 forms the drain drift region of the DMOS transistor to be formed. In the present example, the epitaxial layer is an N-type epitaxial layer 404. When P-type DMOS transistor is to be formed, the substrate can be a P++ substrate and the epitaxial layer can be a P-type epitaxial layer. The substrate 402 and the epitaxial layer 404 form the semiconductor body or the bulk of the DMOS transistor.

At 506, the semiconductor body is patterned to define the active area of the DMOS transistor. In particular, a mask 450 is applied and patterned to cover the active areas where field oxidation should not be formed. At 508, a thermal oxidation process is performed to form a field oxide layer 406 on the semiconductor body. For example, the oxidation process can be a wet oxidation process. As a result of the field oxidation process, field oxide structures 406A and 406B are formed to define the active area of the DMOS transistor, as shown in FIG. 9(*b*). Furthermore, the dielectric separation structure 440 is formed over the drain drift region of the DMOS transistor, as shown in FIG. 9(*b*).

At 510, a thermal oxidation process is performed to form a gate oxide layer 408 on the exposed surface of the semiconductor body. At 512, a polysilicon layer 409 is formed on the semiconductor body and over the dielectric separation layer. That is, the polysilicon layer 409 is deposited on top of the dielectric separation structure 440. The polysilicon layer may be doped by ion implantation to the desired conductivity type and desired resistance. At 514, the polysilicon layer is patterned by a mask 455 to define the planar gate structure. The polysilicon layer 409 is then etched to form the planar gate 410 over the dielectric separation structure 440 and extending to both sides of the dielectric separation structure 440, as shown in FIG. 9(*d*).

At 516, a body implant process using dopants of the second conductivity type is performed to form body regions on either sides of the planar gate 410. In the present example, P-type dopants are used in the body implant process. Furthermore, in one embodiment, the body implant is self-aligned to the planar gate 410. At 518, a source implant process using dopants of the first conductivity type is performed to form source regions in the body regions. In the present example, N-type dopants are used in the source implant process. Furthermore, in one embodiment, the source implant is self-aligned to the planar gate 410. After annealing, source regions 412 and body regions 414 are formed, as shown in FIG. 9(*d*). The planar vertical DMOS transistor 400 is thus formed. The DMOS transistor 400 thus formed includes a lateral channel region under the gate oxide layer 408 and the planar gate 410 and a vertical current path in the drain drift region (N-type semiconductor layer 404).

In some embodiments, additional processing steps may be performed to complete the DMOS transistor device. For example, referring to FIG. 7, an interlayer dielectric layer 416 may be formed over the semiconductor body. Contact openings may be formed in the dielectric layer 416 to provide access to the source regions 412. Metallization may be used to fill the contact openings to form source contacts 418. The backside of the substrate 402 may also be provided with a metallization layer to form the drain electrode.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A planar vertical DMOS transistor comprising:
    a heavily doped semiconductor substrate of a first conductivity type forming a drain region;
    a semiconductor layer of the first conductivity type formed over the semiconductor substrate, the semiconductor layer being more lightly doped than the semiconductor substrate, the semiconductor layer forming a drain drift region;
    a dielectric structure formed on the semiconductor layer;
    first and second conductive spacer structures formed on opposing sides of the dielectric structure and insulated from the semiconductor layer by a gate oxide layer, the first conductive spacer structure being spaced apart from the second conductive spacer structure by the dielectric structure, the first and second conductive spacer structures forming a gate of the DMOS transistor;
    a body region of a second conductivity type, opposite the first conductivity type, formed in the semiconductor layer on outer sides of the first and second conductive spacer structures, a portion of the body region overlapping the first and second conductive spacer structure to form a channel region of the DMOS transistor; and a source region of the first conductivity type formed in the body region and aligned to the outer sides of the first and second conductive spacer structures.

2. The planar vertical DMOS transistor of claim 1, wherein the conductive spacer structures comprise polysilicon spacers formed on the sides of the dielectric structure.

3. The planar vertical DMOS transistor of claim 1, wherein the dielectric structure comprises an oxide structure.

4. The planar vertical DMOS transistor of claim 1, wherein the dielectric structure comprises a field oxide layer.

5. The planar vertical DMOS transistor of claim 1, wherein the body region is formed self-aligned to the conductive spacer structures.

6. The planar vertical DMOS transistor of claim 1, wherein the body region comprises a first body region formed on the outer side of a first conductive spacer structure and a second body region formed on the outer side of a second conductive spacer structure, the first and second conductive spacer structures being formed along the sides of the same dielectric structure, the first body region and the second body region having a separation defined by the dielectric structure.

7. The planar vertical DMOS transistor of claim 6, wherein the first body region and the second body region have a separation sufficient to avoid pinch off of the depletion regions formed in the drain drift region in response to the transistor being turned on.

8. The planar vertical DMOS transistor of claim 1, wherein the first conductivity type is N-type and the second conductivity type is P-type.

9. The planar vertical DMOS transistor of claim 1, wherein the first conductivity type is P-type and the second conductivity type is N-type.

10. A method of forming a planar vertical DMOS transistor, comprising:
providing a heavily doped semiconductor substrate of a first conductivity type
forming a semiconductor layer of the first conductivity type on the semiconductor substrate, the semiconductor layer being more lightly doped than the semiconductor substrate, the semiconductor layer forming a drain drift region;
forming a dielectric structure on the semiconductor layer;
forming a gate oxide layer on the semiconductor layer;
forming first and second conductive spacer structures on opposing sides of the dielectric structure, the first conductive spacer structure being spaced apart from the second conductive spacer structure by the dielectric structure, the first and second conductive spacer structures forming a gate of the DMOS transistor;
forming a body region of a second conductivity type, opposite the first conductivity type, in the semiconductor layer on outer sides of the first and second conductive spacer structures, a portion of the body region overlapping the first and second conductive spacer structures to form a channel region of the DMOS transistor; and
forming a source region of the first conductivity type in the body region and aligned to the outer sides of the first and second conductive spacer structures.

11. The method of claim 10, wherein forming conductive spacer structures on opposing sides of the dielectric structure comprises:
forming a conformal conductive layer on the semiconductor layer over the dielectric structure; and
anisotropically etching the conformal conductive layer to form the conductive spacer structures on the opposing sides of the dielectric structure.

12. The method of claim 11, wherein forming a conformal conductive layer on the semiconductor layer over the dielectric structure comprises:
forming a conformal polysilicon layer on the semiconductor layer over the dielectric structure.

13. The method of claim 10, wherein forming a dielectric structure on the semiconductor layer comprises:
forming an oxide structure on the semiconductor layer.

14. The method of claim 10, wherein forming a dielectric structure on the semiconductor layer comprises:
forming a field oxide layer on the semiconductor layer;
masking the field oxide layer to define an area corresponding to the dielectric structure; and
etching the field oxide layer to form the dielectric structure.

15. The method of claim 10, wherein forming a body region of the second conductivity type in the semiconductor layer on outer sides of the conductive spacer structures comprises:
forming the body region self-aligned to the outer sides of the conductive spacer structures.

16. The method of claim 10, wherein forming a body region of the second conductivity type in the semiconductor layer on outer sides of the conductive spacer structures comprises:
forming a first body region formed on the outer side of a first conductive spacer structure and a second body region formed on the outer side of a second conductive spacer structure, the first and second conductive spacer structures being formed along the sides of the same dielectric structure, the first body region and the second body region having a separation defined by the dielectric structure.

17. The method of claim 16, wherein the first body region and the second body region have a separation sufficient to avoid pinch off of the depletion regions formed in the drain drift region in response to the transistor being turned on.

18. The method of claim 10, wherein the first conductivity type is N-type and the second conductivity type is P-type.

19. The method of claim 10, wherein the first conductivity type is P-type and the second conductivity type is N-type.

* * * * *